US010763170B2

(12) United States Patent
Verma et al.

(10) Patent No.: US 10,763,170 B2
(45) Date of Patent: Sep. 1, 2020

(54) SEMICONDUCTOR DEVICE INCLUDING BURIED INSULATION LAYER AND MANUFACTURING METHOD THEREOF

(71) Applicant: UNITED MICROELECTRONICS CORP., Hsin-Chu (TW)

(72) Inventors: Purakh Raj Verma, Singapore (SG); Su Xing, Singapore (SG); Ching-Yang Wen, Pingtung County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 133 days.

(21) Appl. No.: 15/928,105

(22) Filed: Mar. 22, 2018

(65) Prior Publication Data

US 2019/0252253 A1 Aug. 15, 2019

(30) Foreign Application Priority Data

Feb. 14, 2018 (CN) .......................... 2018 1 0151286

(51) Int. Cl.
*H01L 21/768* (2006.01)
*H01L 27/12* (2006.01)
*H01L 23/48* (2006.01)
*H01L 23/528* (2006.01)
(Continued)

(52) U.S. Cl.
CPC ........ *H01L 21/76898* (2013.01); *H01L 21/84* (2013.01); *H01L 23/481* (2013.01);
(Continued)

(58) Field of Classification Search
CPC ........... H01L 21/76898; H01L 27/1207; H01L 29/78696; H01L 29/78618;
(Continued)

(56) References Cited

U.S. PATENT DOCUMENTS 6,611,027 B2 * 8/2003 Ichikawa ............ H01L 27/0266
257/347
7,414,289 B2 * 8/2008 Wu ......................... H01L 21/84
257/347
(Continued)

OTHER PUBLICATIONS

Li, Title of Invention: Semiconductor Device and Fabrication Method Thereof, U.S. Appl. No. 15/691,757, filed Aug. 31, 2017.
(Continued)

*Primary Examiner* — Khiem D Nguyen
(74) *Attorney, Agent, or Firm* — Winston Hsu

(57) ABSTRACT

A semiconductor device includes a buried insulation layer, a semiconductor layer, a gate structure, a source doped region, and a drain doped region. The semiconductor layer is disposed on the buried insulation layer. The gate structure is disposed on the semiconductor layer. The semiconductor layer includes a body region disposed between the gate structure and the buried insulation layer. The source doped region and the drain doped region are disposed in the semiconductor layer. A first contact structure penetrates the buried insulation layer and contacts the body region. A second contact structure penetrates the buried insulation layer and is electrically connected with the source doped region. At least a part of the first contact structure overlaps the body region in a thickness direction of the buried insulation layer. The body region is electrically connected with the source doped region via the first contact structure and the second contact structure.

17 Claims, 9 Drawing Sheets

(51) Int. Cl.
  *H01L 29/786* (2006.01)
  *H01L 29/417* (2006.01)
  *H01L 23/522* (2006.01)
  *H01L 21/84* (2006.01)

(52) U.S. Cl.
  CPC ...... *H01L 23/5226* (2013.01); *H01L 23/5283* (2013.01); *H01L 27/1203* (2013.01); *H01L 27/1207* (2013.01); *H01L 29/41733* (2013.01); *H01L 29/78615* (2013.01); *H01L 29/78618* (2013.01); *H01L 29/78696* (2013.01)

(58) Field of Classification Search
  CPC ............. H01L 29/78615; H01L 23/481; H01L 23/5226; H01L 21/84; H01L 27/1203; H01L 29/78639; H01L 23/6226
  See application file for complete search history.

(56) References Cited

U.S. PATENT DOCUMENTS

| | | | | |
|---|---|---|---|---|
| 8,872,274 | B2* | 10/2014 | Cohen | H01L 21/823412 257/386 |
| 9,159,791 | B2* | 10/2015 | Chen | H01L 29/41766 |
| 2006/0289904 | A1* | 12/2006 | Tsujiuchi | H01L 21/76283 257/288 |
| 2008/0054313 | A1* | 3/2008 | Dyer | G03F 9/7084 257/276 |
| 2008/0239789 | A1* | 10/2008 | Shino | G11C 11/404 365/149 |
| 2011/0233620 | A1* | 9/2011 | Naruse | H01L 23/5226 257/225 |
| 2012/0231620 | A1* | 9/2012 | Kuroda | H01L 21/74 438/586 |
| 2014/0291860 | A1* | 10/2014 | Stuber | H01L 23/481 257/774 |
| 2014/0367753 | A1* | 12/2014 | Huang | H01L 29/66477 257/288 |
| 2016/0353038 | A1* | 12/2016 | Madurawe | H01L 29/42384 |
| 2017/0170177 | A1* | 6/2017 | Tasbas | H01L 29/45 |

OTHER PUBLICATIONS

He, Title of Invention: Radiofrequency Switch Device and Manufacturing Method Thereof, U.S. Appl. No. 15/802,419, filed Nov. 2, 2017.

* cited by examiner

SEMICONDUCTOR DEVICE INCLUDING BURIED INSULATION LAYER AND MANUFACTURING METHOD THEREOF

BACKGROUND OF THE INVENTION

1. Field of the Invention

The present invention relates to a semiconductor device and a manufacturing method thereof, and more particularly, to a semiconductor device including a buried insulation layer and a manufacturing method thereof.

2. Description of the Prior Art

In the semiconductor manufacturing related field, the size of functional devices in the integrated circuits becomes smaller continuously for enhancing the performance of the chip. However, as the density of the functional devices increased, the influence of many electrical properties on the device operation performance becomes more obvious, and that will hinder the development of scaling down. For example, in the semiconductor manufacturing process employing silicon on insulator (SOI) substrates, the semiconductor layer in the SOI substrate has to become thinner for enhancing the performance of a switching device, such as a switching transistor. However, the kink effect will be a problem generated by the extremely thin semiconductor layer, and the operation performance of other types of semiconductor devices such as high voltage transistor may be affected accordingly. Therefore, the structure design and the manufacturing method of different types of semiconductor devices have to be integrated for forming different types of semiconductor devices on the SOI substrate.

SUMMARY OF THE INVENTION

A semiconductor device and a manufacturing method thereof are provided in the present invention. A contact structure and/or a contact hole is formed on a side of a semiconductor layer facing a buried insulation layer for electrically connecting a body region of the semiconductor layer and a source doped region. The purpose of improving the kink effect may be achieved accordingly.

According to an embodiment of the present invention, a semiconductor device is provided. The semiconductor device includes a buried insulation layer, a semiconductor layer, a gate structure, a source doped region, a drain doped region, a first contact structure, and a second contact structure. The semiconductor layer is disposed on a side of the buried insulation layer. The gate structure is disposed on the semiconductor layer. The semiconductor layer includes a body region disposed between the gate structure and the buried insulation layer. The source doped region and the drain doped region are disposed in the semiconductor layer at two opposite sides of the gate structure respectively. The first contact structure penetrates the buried insulation layer and contacts the body region. At least a part of the first contact structure overlaps the body region in a thickness direction of the buried insulation layer. The second contact structure penetrates the buried insulation layer and is electrically connected with the source doped region. The body region is electrically connected with the source doped region via the first contact structure and the second contact structure.

According to an embodiment of the present invention, a manufacturing method of a semiconductor device is provided. The manufacturing method includes the following steps. Firstly, a semiconductor layer disposed on a buried insulation layer is provided. A gate structure is formed on the semiconductor layer. The semiconductor layer includes a body region disposed between the gate structure and the buried insulation layer. A source doped region and a drain doped region are formed in the semiconductor layer at two opposite sides of the gate structure respectively. A first contact structure penetrating the buried insulation layer and contacting the body region is formed. At least a part of the first contact structure overlaps the body region in a thickness direction of the buried insulation layer. A second contact structure penetrating the buried insulation layer and electrically connected with the source doped region is formed. The body region is electrically connected with the source doped region via the first contact structure and the second contact structure.

According to another embodiment of the present invention, a semiconductor device is provided. The semiconductor device includes a buried insulation layer, a semiconductor layer, a gate structure, a source doped region, a drain doped region, a contact hole, a silicide layer, a first contact structure, and a second contact structure. The semiconductor layer is disposed on a side of the buried insulation layer. The gate structure is disposed on the semiconductor layer. The semiconductor layer includes a body region disposed between the gate structure and the buried insulation layer. The source doped region and the drain doped region are disposed in the semiconductor layer at two opposite sides of the gate structure respectively. The contact hole penetrates the buried insulation layer and exposes a part of the body region and a part of the source doped region. The silicide layer is disposed in the contact hole and disposed on the part of the body region and the part of the source doped region exposed by the contact hole. The body region is electrically connected with the source doped region via the silicide layer. The first contact structure is disposed on the silicide layer. The second contact structure penetrates the buried insulation layer and is electrically connected with the drain doped region.

According to another embodiment of the present invention, a manufacturing method of a semiconductor device is provided. The manufacturing method includes the following steps. Firstly, a semiconductor layer disposed on a buried insulation layer is provided. A gate structure is formed on the semiconductor layer. The semiconductor layer includes a body region disposed between the gate structure and the buried insulation layer. A source doped region and a drain doped region are formed in the semiconductor layer at two opposite sides of the gate structure respectively. A contact hole penetrating the buried insulation layer and exposing a part of the body region and a part of the source doped region is formed. A silicide layer is formed in the contact hole. The silicide layer is formed on the part of the body region and the part of the source doped region exposed by the contact hole. The body region is electrically connected with the source doped region via the silicide layer. A first contact structure is formed on the silicide layer. A second contact structure penetrating the buried insulation layer and electrically connected with the drain doped region is formed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 3-5 are schematic drawings illustrating a manufacturing method of the semiconductor device according to the first embodiment of the present invention, wherein FIG. 4 is a schematic drawing in a step subsequent to FIG. 3, and FIG. 5 is a schematic drawing in a step subsequent to FIG. 4.

FIG. 8 and FIG. 9 are schematic drawings illustrating a manufacturing method of the semiconductor device according to the third embodiment of the present invention, wherein FIG. 9 is a schematic drawing in a step subsequent to FIG. 8.

DETAILED DESCRIPTION

In the following description, numerous embodiments are set forth in order to disclose specific features of the present invention, but not limited thereto. For one of ordinary skill in the related art, it should be understood that when an element such as a region, a layer, or a portion is referred to as being "formed" on another element, it can be directly, formed on the given element, or intervening elements may be present. However, when an element is described to be directly formed on another element, there is not any intervening element. Additionally, when an element is referred to as being "formed" on another element, the element may be formed on the given element by growth, deposition, etch, attach, connect, couple, or other approaches.

Spatially relative terms, such as "bottom", "below", "above", "top", and the like, may be used herein for ease of description to describe one element or feature's relationship to another element(s) or feature(s) as illustrated in the figures. It will be understood that spatially relative terms are intended to encompass different orientations of the device in use or operation in addition to the orientations depicted in the figures. For example, if the device in the figures in turned over, elements described as "on" or "above" can encompass both an orientation of above and below. The device may be otherwise oriented and the spatially relative descriptors used herein interpreted accordingly.

Figure 1:
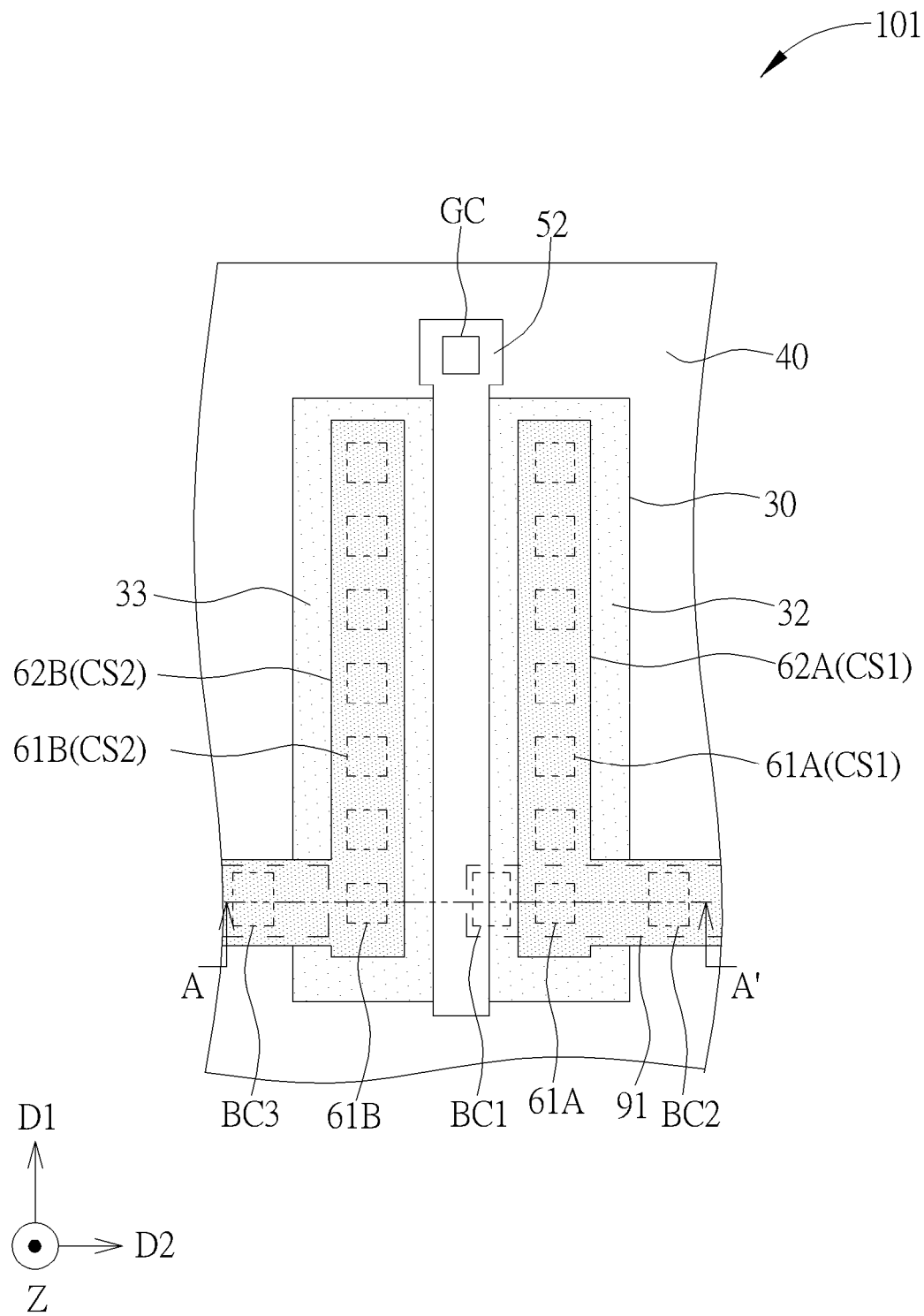
FIG. 1 is a top view schematic drawing illustrating a semiconductor device according to a first embodiment of the present invention.
Figure 2:
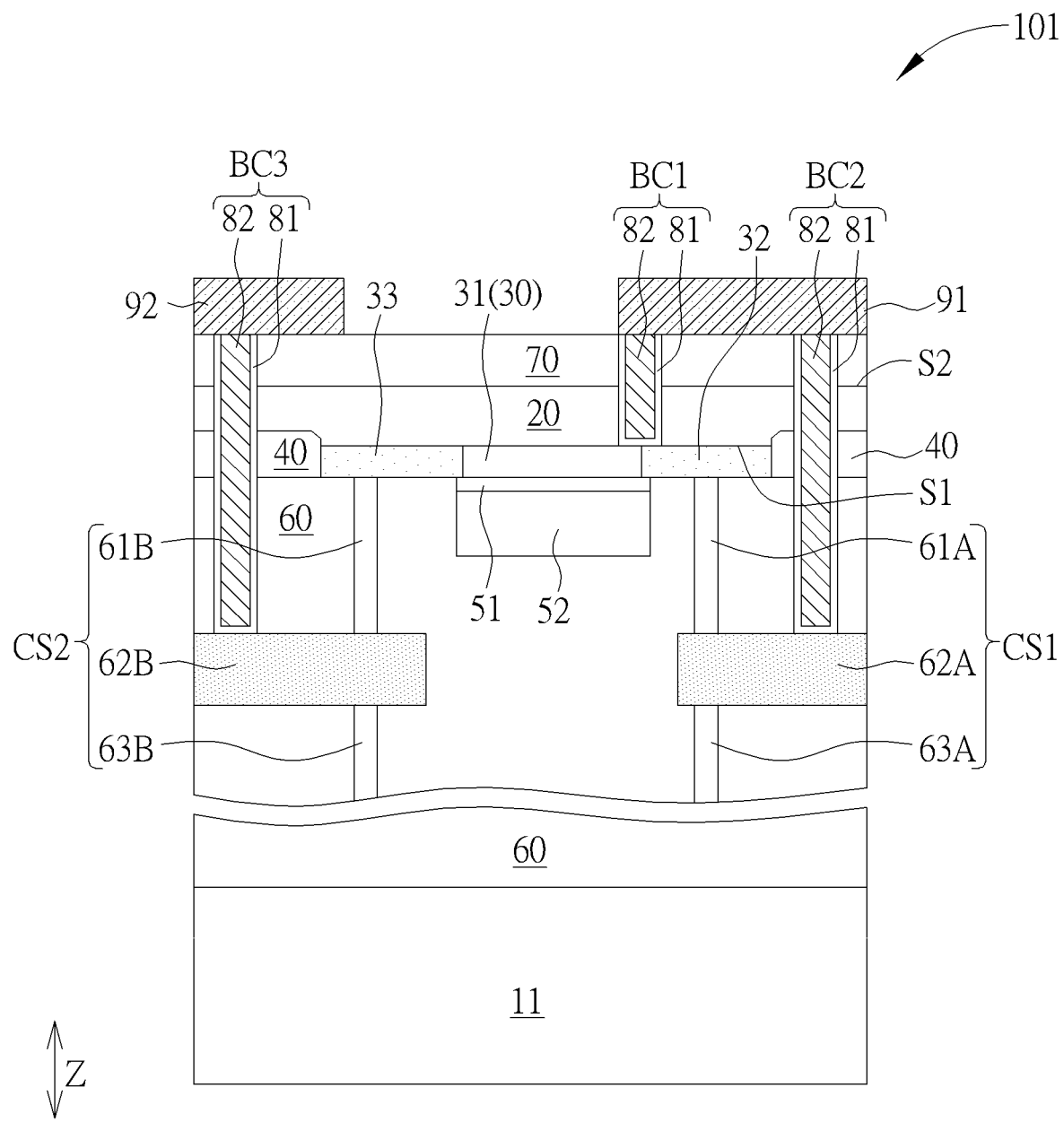
FIG. 2 is a cross-sectional diagram taken along a line A-A' in FIG. 1.

Please refer to FIG. 1 and FIG. 2. FIG. 1 is a top view schematic drawing illustrating a semiconductor device according to a first embodiment of the present invention. FIG. 2 is a cross-sectional diagram taken along a line A-A' in FIG. 1. As shown in FIG. 1 and FIG. 2, a semiconductor device 101 is provided in the present invention. The semiconductor device 101 includes a buried insulation layer 20, a semiconductor layer 30, a gate structure 52, a source doped region 32, a drain doped region 33, a first contact structure BC1, and a second contact structure BC2. The semiconductor layer 30 is disposed on a side of the buried insulation layer 20. In some embodiments, the buried insulation layer 20 may have a first side S1 and a second side S2 opposite to the first side S1 in a thickness direction Z of the buried insulation layer 20, and the semiconductor layer may be disposed on the first side S1 of the buried insulation layer 20. Additionally, in some embodiments, the buried insulation layer 20 and the semiconductor layer 30 may be an insulation layer and a semiconductor layer in a silicon-on-insulator (SOI) substrate respectively, the buried insulation layer 20 may include a buried oxide insulation layer, and the semiconductor layer 30 may be a silicon-containing semiconductor layer, but not limited thereto. In some embodiments, the buried insulation layer 20 may be formed by other insulation materials and/or the semiconductor layer 30 may be formed by other semiconductor materials according to other considerations. When the buried insulation layer 20 and the semiconductor layer 30 are the insulation layer and the semiconductor layer in the SOI substrate respectively, the first side S1 of the buried insulation layer 20 may be regarded as a front side, and the second side S2 of the buried insulation layer 20 may be regarded as a back side, but not limited thereto. The gate structure 52 is disposed on the semiconductor layer 30, and a gate dielectric layer 51 may be disposed between the gate structure 52 and the semiconductor layer 30. Therefore, the gate dielectric layer 51, the gate structure 52, and the semiconductor layer 30 may be disposed on the first side S1 of the buried insulation layer 20. In some embodiments, the gate structure 52 may include a non-metal gate such as a polysilicon gate, a non-metal gate formed by other suitable conductive materials, or a metal gate. The gate dielectric layer 51 may include an oxide layer such as a silicon oxide layer or other suitable dielectric materials such as a high dielectric constant (high-k) dielectric material. The semiconductor layer 30 may include a body region 31 disposed between the gate structure 52 and the buried insulation layer 20 in the thickness direction Z, and the body region 31 may include a channel region of the semiconductor device 101, but not limited thereto. The source doped region 32 and the drain doped region 33 are disposed in the semiconductor layer 30 at two opposite sides of the gate structure 52 respectively. In other words, the source doped region 32 and the drain doped region 33 are disposed in the semiconductor layer 30, and the source doped region 32 and the drain doped region are located at tow opposite sides of the gate structure 52 respectively. For example, in some embodiments, the gate structure 52 may be elongated in a first direction D1, the source doped region 32 and the drain doped region 33 may be disposed at two opposite sides of the gate structure 52 in a second direction D2 orthogonal to the first direction D1 respectively, and the source doped region 32 and the drain doped region 33 may also be elongated in the first direction D1 respectively, but not limited thereto. In some embodiments, the source doped region 32 and the drain doped region 33 may be doped regions including N type dopants such as phosphorus and arsenic, and the body region 31 may include a well such as a P well, but not limited thereto. In some embodiments, the source doped region 32 and the drain doped region 33 may also be formed by other kinds of N type dopants or dopants with other conductivity types.

The first contact structure BC1 penetrates the buried insulation layer 20 and contacts the body region 31, and at least a part of the first contact structure BC1 overlaps the body region 31 in the thickness direction Z of the buried insulation layer 20. In other words, in some embodiments, a part of the body region 31 may be disposed between the first contact structure BC1 and the gate structure 52 in the thickness direction Z of the buried insulation layer 20. The second contact structure BC2 penetrates the buried insulation layer 20 and is electrically connected with the source doped region 32. The body region 31 is electrically connected with the source doped region 32 via the first contact structure BC1 and the second contact structure BC2. The first contact structure BC1 and the second contact structure BC2 may penetrate the buried insulation layer 20 from the back side (i.e. the second side S2) to the front side (i.e. the first side S1), and the first contact structure BC1 and the second contact structure BC2 may be regarded as back side contact structures, but not limited thereto. In addition, the semiconductor device 101 may further include a gate contact structure GC electrically connected with the gate structure 52, and the gate contact structure GC may be electrically connected with the gate structure 52 from the back side or the front side of the buried insulation layer 20 according to different considerations. The first contact structure BC1 and the second contact structure BC2 may be formed by a barrier layer 81 and a conductive material 82. The barrier layer 81 may include titanium nitride, tantalum nitride, or other suitable barrier materials, and the conductive material 82 may include conductive materials having relatively lower resistivity, such as copper, aluminum, and tungsten, but not limited thereto. In some embodiments, the first contact structure BC1 may penetrate the buried insulation layer 20 for directly contacting the body region 31 and the source doped region 32, and the first contact structure BC1 may partly overlap the source doped region 32 in the thickness direction Z of the buried insulation layer 20, but not limited thereto.

Specifically, in some embodiments, the semiconductor device 101 may further include an isolation structure 40, a first connection structure CS1, and a second connection structure CS2. The isolation structure 40 is disposed on the buried insulation layer 20 and surrounds the semiconductor layer 30. The isolation structure 40 may include a single layer or multiple layers of insulation materials such as an oxide insulation material or a nitride insulation material, but not limited thereto. The first connection structure CS1 is disposed on the source doped region 32 and electrically connected with the source doped region 32. The second connection structure CS2 is disposed on the drain doped region 33 and electrically connected with the drain doped region 33. The semiconductor device 101 may include an interlayer dielectric layer 60 located at the first side S1 of the buried insulation layer 20 and covering the source doped region 32, the drain doped region 33, the isolation structure 40, and the gate structure 52, and the first connection structure CS1 and the second connection structure CS2 may be disposed in the interlayer dielectric layer 60. The interlayer dielectric layer 60 may include multiple layers of dielectric materials such as silicon oxide, silicon oxynitride, low dielectric constant (low-k) material, or other suitable dielectric materials. The second contact structure BC2 may penetrate the buried insulation layer 20 and the isolation structure 40 for being connected with the first connection structure CS1, and the second contact structure BC2 may be electrically connected with the source doped region 32 via the first connection structure CS1.

In some embodiments, the first connection structure CS1 may include a plurality of plugs (such as a first plug 61A and a third plug 63A shown in FIG. 2) and a plurality of conductive layers (such as a first metal layer 62A shown in FIG. 2) alternately disposed and stacked, and the second connection structure CS2 may include a plurality of plugs (such as a second plug 61B and a fourth plug 63B shown in FIG. 2) and a plurality of conductive layers (such as a second metal layer 62B shown in FIG. 2) alternately disposed and stacked, but not limited thereto. The first plug 61A, the second plug 61B, the third plug 63A, the fourth plug 63B, the first metal layer 62A, and the second metal layer 62B may include a low resistivity material and a battier layer respectively, but not limited thereto. The low resistivity material mentioned above may include materials having relatively lower resistivity, such as copper, aluminum, and tungsten, and the barrier layer mentioned above may include titanium nitride, tantalum nitride, or other suitable barrier materials, but not limited thereto. The second contact structure BC2 may penetrate the buried insulation layer 20, the isolation structure 40, and the interlayer dielectric layer 60 located between the isolation structure 40 and the first metal layer 62A for contacting the first metal layer 62A of the first connection structure CS1, and the second contact structure BC2 may be electrically connected with the source doped region 32 via the first metal layer 62A and the first plug 61A of the first connection structure CS1, but not limited thereto.

In some embodiments, the semiconductor device 101 may further include a third contact structure BC3 penetrating the buried insulation layer 20 and the isolation structure 40 for being connected with the second connection structure CS2, and the third contact structure BC3 is electrically connected with the drain doped region 33 via the second connection structure CS2. In some embodiments, the third contact structure BC3 may be formed by the barrier layer 81 and the conductive material 82 also, and the third contact structure BC3 may be regarded as a back side contact structure, but not limited thereto. Specifically, the third contact structure BC3 may penetrate the buried insulation layer 20, the isolation structure 40, and the interlayer dielectric 60 located between the isolation structure 40 and the second metal layer 62B for contacting the second metal layer 62B of the second connection structure CS2, and the third contact structure BC3 may be electrically connected with the drain doped region 33 via the second metal layer 62B and the second plug 61B of the second connection structure CS2, but not limited thereto. In some embodiments, the semiconductor device 101 may further include a conductive layer (such as a first conductive layer 91 shown in FIG. 1 and FIG. 2) disposed at the second side S2 of the buried insulation layer 20. The first conductive layer 91 contacts and is connected with the first contact structure BC1 and the second contact structure BC2, and the body region 31 may be electrically connected with the source doped region 32 via the first contact structure BC1, the first conductive layer 91, and the second contact structure BC2.

In some embodiments, the semiconductor device 101 may further include an insulation layer 70 disposed at the second side S2 of the buried insulation layer 20. The first contact structure BC1 and the second contact structure BC2 may further penetrate the insulation layer 70, and the first conductive layer 91 may be disposed on the insulation layer, but not limited thereto. Additionally, the semiconductor device 101 may further include a second conductive layer 92 disposed on the insulation layer 70, and the second conductive layer 92 may contact and be connected with the third contact structure BC3, but not limited thereto. The insulation layer 70 may include silicon nitride, silicon oxynitride, or other suitable insulation materials. The first conductive layer 91 and the second conductive layer 92 may include conductive materials having relatively lower resistivity, such as copper, aluminum, and tungsten, and the first conductive layer 91 and the second conductive layer 92 may be used to transmitting signal at the back side of the semiconductor device 101, but not limited thereto. In addition, a substrate (such as a second substrate 11 shown in FIG. 2) may be disposed at a side of the interlayer dielectric layer 60 opposite to another side of the interlayer dielectric layer 60 facing the semiconductor layer 30, and the second substrate 11 may include a high resistance silicon substrate, a glass substrate, a plastic substrate, a sapphire substrate, or other suitable insulation substrates.

In the semiconductor device 101, the first contact structure BC1 is disposed at a side of the semiconductor layer 30 facing the buried insulation layer 20, and the first contact structure BC1 penetrates the buried insulation layer 20 for contacting and being electrically connected with the body region 31 of the semiconductor layer 30. The kink effect may be improved accordingly especially when the semiconductor layer 30 is relatively thinner. Additionally, the influence of the first contact structure BC1 on the total area of the semiconductor device 101 may be reduced for benefiting the miniaturization of the semiconductor device 101 because the first contact structure BC1 may contact and be electrically connected with the body region 31 from the back side. In some embodiments, the semiconductor device 101 may be regarded as a high voltage transistor applied in a low noise amplifier (LNA) and/or a power amplifier (PA), but not limited thereto.

Figure 3:
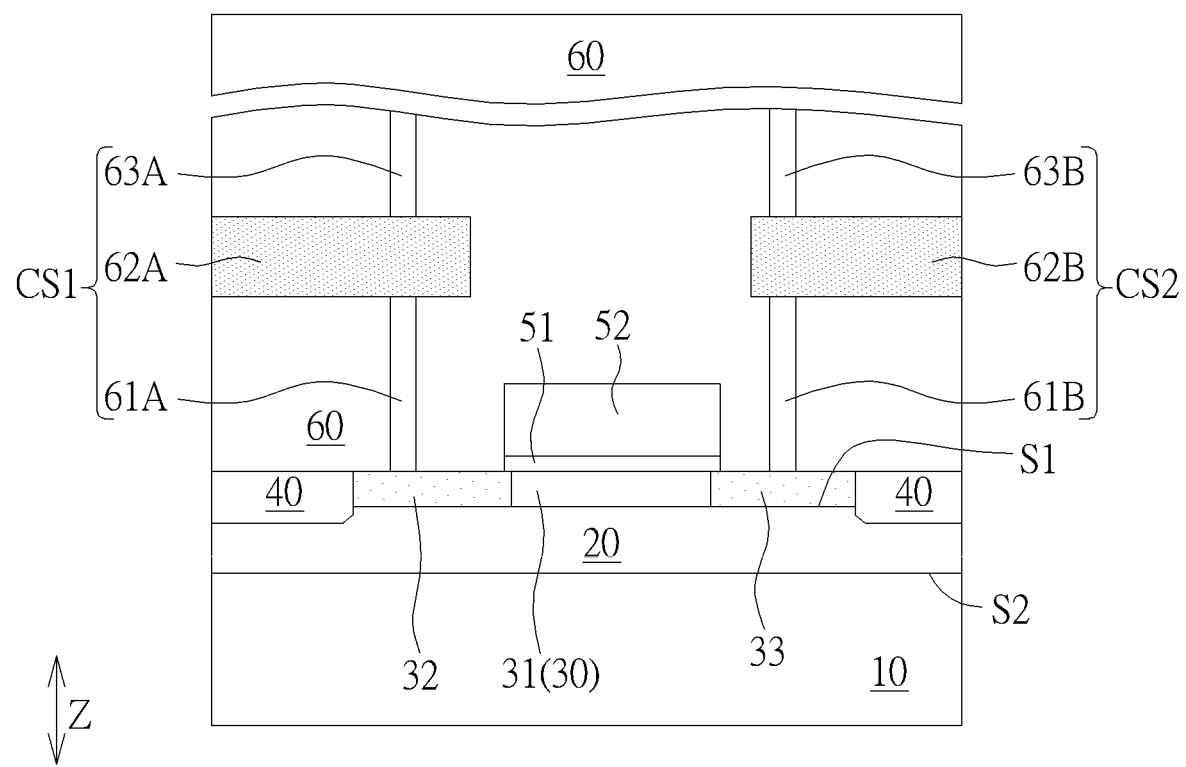
Figure 4:
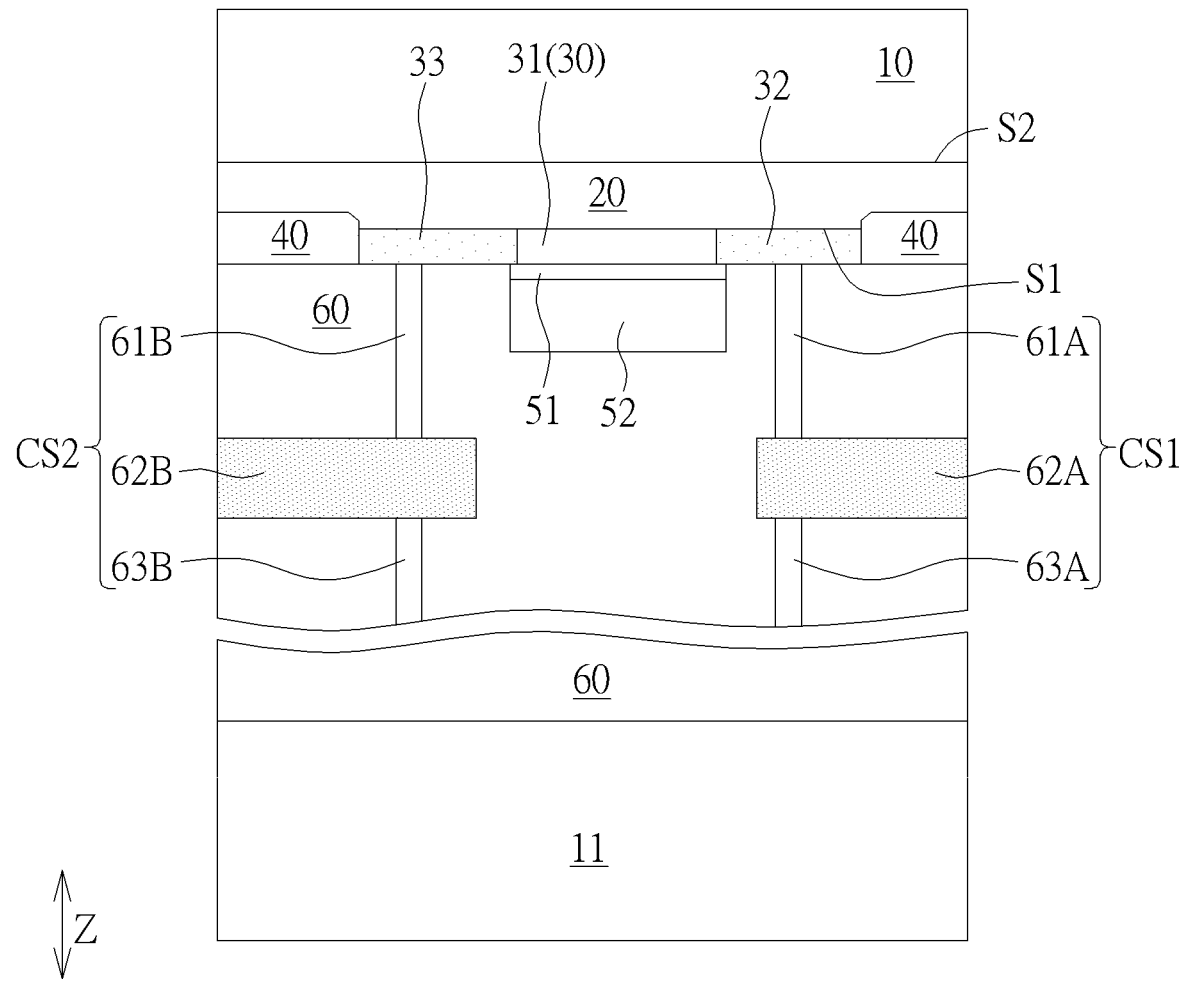
Figure 5:
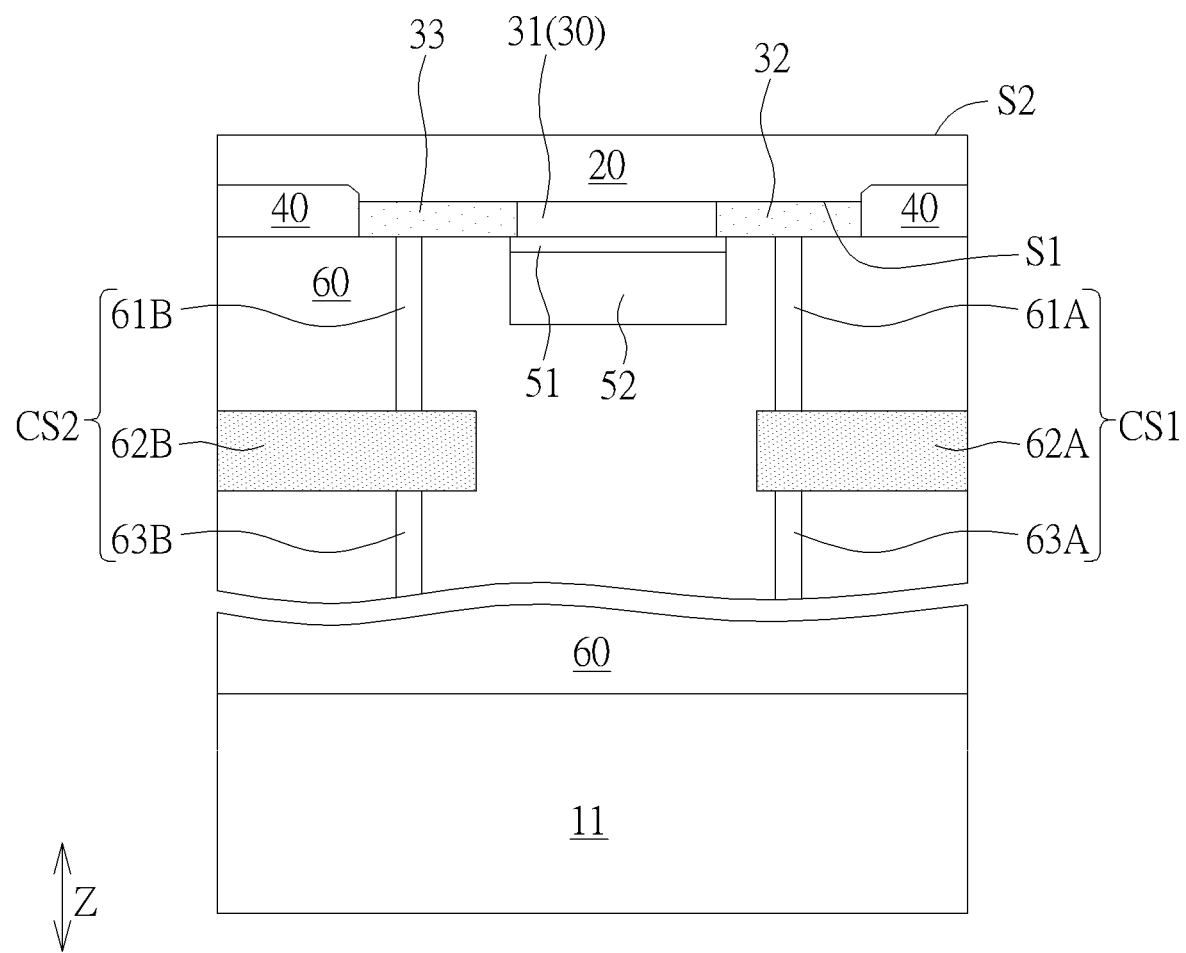

Please refer to FIGS. 2-5. FIGS. 3-5 are schematic drawings illustrating a manufacturing method of the semiconductor device according to the first embodiment of the present invention. FIG. 4 is a schematic drawing in a step subsequent to FIG. 3, FIG. 5 is a schematic drawing in a step subsequent to FIG. 4, and FIG. 2 may be regarded as a schematic drawing in a step subsequent to FIG. 5. As shown in FIG. 2, the manufacturing method of the semiconductor device in this embodiment may include the following steps. Firstly, the semiconductor layer 30 disposed on the buried insulation layer 20 is provided. The gate structure 52 is formed on the semiconductor layer 30. The semiconductor layer 30 includes the body region 31 disposed between the gate structure 52 and the buried insulation layer 20. The source doped region 32 and the drain doped region 33 are formed in the semiconductor layer 30 at two opposite sides of the gate structure 52 respectively. The first contact structure BC1 is formed penetrating the buried insulation layer 20 and contacting the body region 31. At least apart of the first contact structure BC1 overlaps the body region 31 in the thickness direction Z of the buried insulation layer 20. The second contact structure BC2 is formed penetrating the buried insulation layer 20 and electrically connected with the source doped region 32. The body region 31 may be electrically connected with the source doped region 32 via the first contact structure BC1 and the second contact structure BC2.

Specifically, the manufacturing method of the semiconductor device 101 in this embodiment may include but is not limited to the following steps. As shown in FIG. 3, the isolation structure 40 may be formed on the buried insulation layer 20 and the isolation structure 40 may surround the semiconductor layer 30. Subsequently, after the steps of forming the gate structure 52, the source doped region 32, and the drain doped region 33, the interlayer dielectric layer 60, the first connection structure CS1, and the second connection structure CS2 are formed. The first connection structure CS1 is formed on the source doped region 32, and the first connection structure CS1 is electrically connected with the source doped region 32. The second connection structure CS2 is formed on the drain doped region 33, and the second connection structure CS2 is electrically connected with the drain doped region 33. In other words, the semiconductor layer 30, the source doped region 32, the drain doped region 33, the gate structure 52, the interlayer dielectric layer 60, the first connection structure CS1, and the second connection structure CS2 may be disposed on the first side S1 of the buried insulation layer 20. Additionally, a first substrate 10 may be disposed on the second side S2 of the buried insulation layer 20. The first substrate 10, the buried insulation layer 20, and the semiconductor layer 30 may be regarded as an SOI substrate, and the first substrate 10 may be a low resistivity substrate, but not limited thereto.

Subsequently, as shown in FIG. 3 and FIG. 4, after the steps of forming the interlayer dielectric layer 60, the first connection structure CS1, and the second connection structure CS2, the first substrate 10 may be turned over, and a side of the interlayer dielectric layer 60 opposite to the semiconductor layer 30 may be connected with the second substrate 11. As shown in FIG. 4 and FIG. 5, the first substrate 10 is then removed to expose the second side S2 of the buried insulation layer 20. Subsequently, as shown in FIG. 5 and FIG. 2, the first contact structure BC1, the second contact structure BC2, the third contact structure BC3 described above are formed. In other words, the first connection structure CS1 and the second connection structure CS2 may be formed before the steps of forming the first contact structure BC1, the second contact structure BC2, and the third contact structure BC3, but not limited thereto. The second contact structure BC2 may penetrate the buried insulation layer 20, the isolation structure 40, and the interlayer dielectric layer 60 located between the isolation structure 40 and the first metal layer 62A for being connection with the first connection structure CS1, and the second contact structure BC2 may be electrically connected with the source doped region 32 via the first metal layer 62A and the first plug 61A in the first connection structure CS1, but not limited thereto. The third contact structure BC3 may penetrate the buried insulation layer 20, the isolation structure 40, and the interlayer dielectric layer 60 located between the isolation structure 40 and the second metal layer 62B for being connected with the second connection structure CS2, and the third contact structure BC3 may be electrically connected with the drain doped region 33 via the second metal layer 62B and the second plug 61B in the second connection structure CS2, but not limited thereto.

It is worth noting that, in some embodiments, the first contact structure BC1, the second contact structure BC2, and the third contact structure BC3 may be formed concurrently, and the first contact structure BC1, the second contact structure BC2, and the third contact structure BC3 may be formed by the barrier layer 81 and the conductive material 82 for process simplification, but not limited thereto. In some embodiments, the first contact structure BC1, the second contact structure BC2, and the third contact structure BC3 may formed by different processes and/or different materials according to some considerations. Additionally, a conductive layer (such as the first conductive layer 91 shown in FIG. 2) may be formed at the second side S2 of the buried insulation layer 20. The first conductive layer 91 may contact and be connected with the first contact structure BC1 and the second contact structure BC2, and the body region 31 may be electrically connected with the source doped region 32 via the first contact structure BC1, the first conductive layer 91, the second contact structure BC2, and the first connection structure CS1. In some embodiments, the insulation layer 70 may be formed on the second side S2 of the buried insulation layer 20 before the steps of forming the first contact structure BC1, the second contact structure BC2, and the third contact structure BC3 according to some considerations, and the first contact structure BC1, the second contact structure BC2, and the third contact structure BC3 may further penetrate the insulation layer 70, but not limited thereto. Therefore, the first conductive layer 91 may be formed on the insulation layer 70, and the second conductive layer 92 contacting and connected with the third contact structure BC3 may be formed on the insulation layer 70 also, but not limited thereto.

The following description will detail the different embodiments of the present invention. To simplify the description, identical components in each of the following embodiments are marked with identical symbols. For making it easier to understand the differences between the embodiments, the following description will detail the dissimilarities among different embodiments and the identical features will not be redundantly described.

Figure 6:
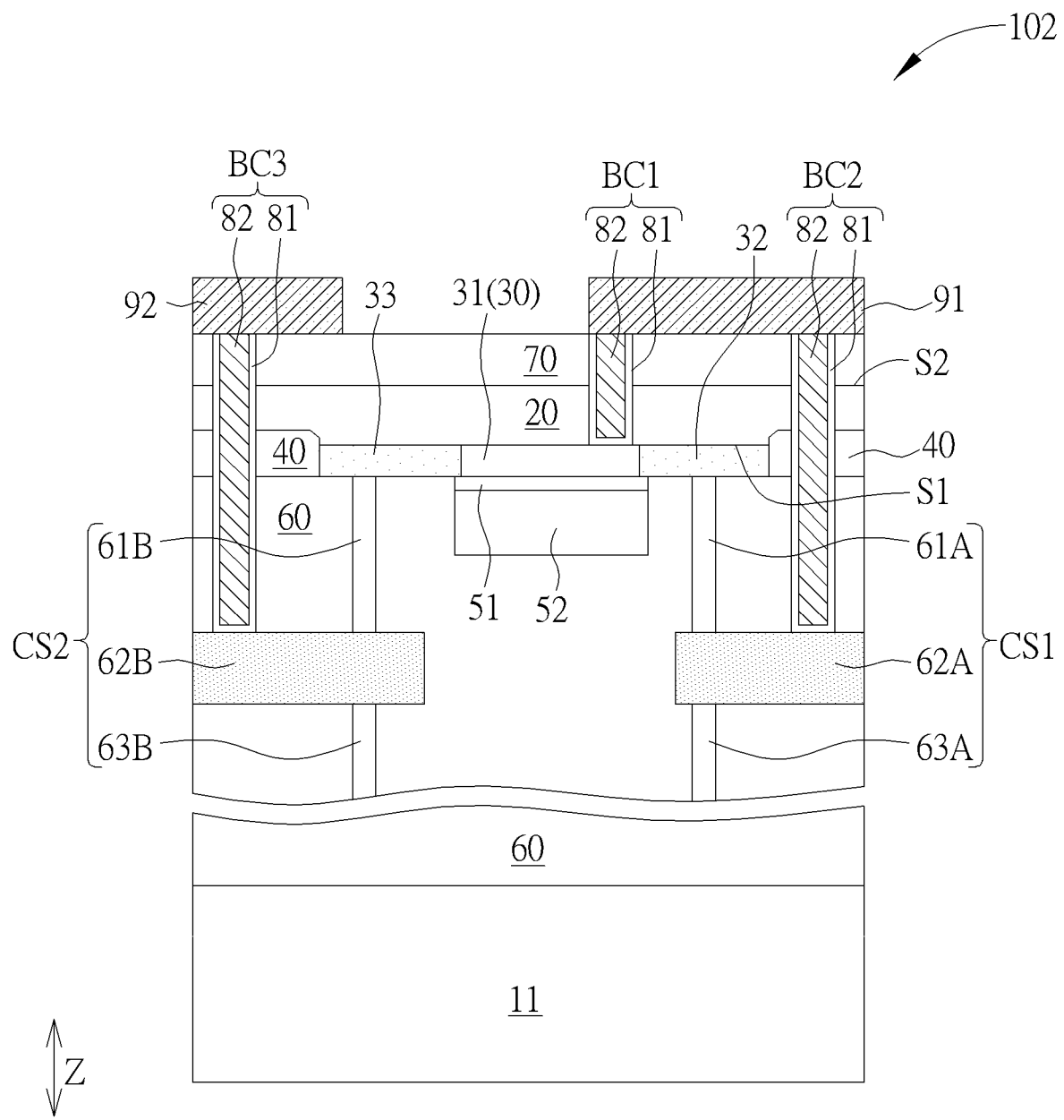
FIG. 6 is a schematic drawing illustrating a semiconductor device according to a second embodiment of the present invention.

FIG. 6 is a schematic drawing illustrating a semiconductor device 102 according to a second embodiment of the present invention. The difference between the semiconductor device 102 and the semiconductor device in the first embodiment described above is that the first contact structure BC1 may contact and be electrically connected with the body region 31 of the semiconductor layer 30, and the first contact structure BC1 in this embodiment may not directly contact the source doped region 32. Therefore, in some embodiments, the first contact structure BC1 may not overlap the source doped region 32 in the thickness direction Z of the buried insulation layer 20, and the first contact structure BC1 may be completely overlapped by the body region 31 and/or the gate structure 52 in the thickness direction Z, but not limited thereto.

Figure 7:
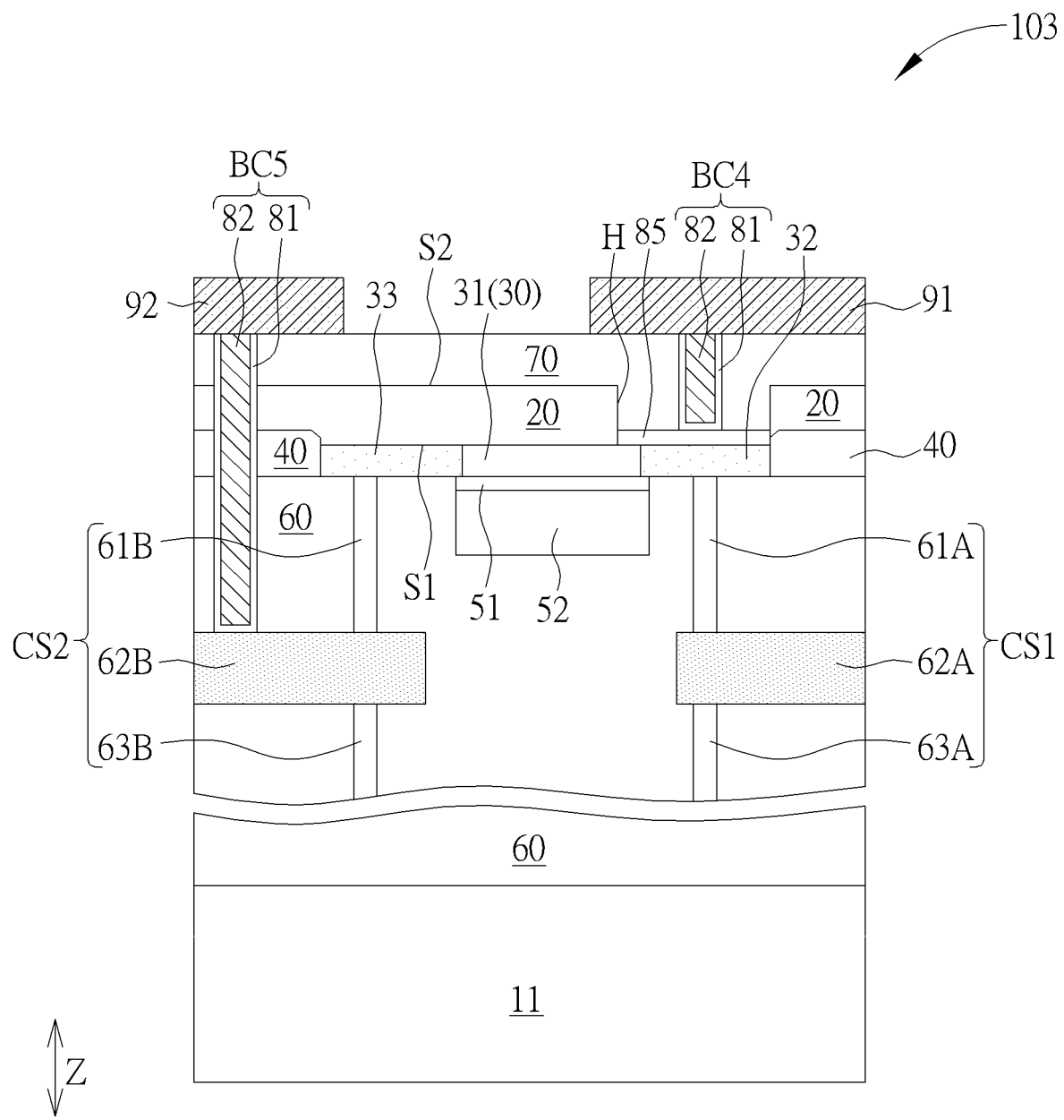
FIG. 7 is a schematic drawing illustrating a semiconductor device according to a second embodiment of the present invention.

Please refer to FIG. 7. FIG. 7 is a schematic drawing illustrating a semiconductor device 103 according to a second embodiment of the present invention. As shown in FIG. 7, the semiconductor device 103 includes the buried insulation layer 20, the semiconductor layer 30, the gate structure 52, the source doped region 32, the drain doped region 33, a contact hole H, a silicide layer 85, a first contact structure (such as a fourth contact structure BC4 shown in FIG. 7), and a second contact structure (such as a fifth contact structure BC5 shown in FIG. 7). The semiconductor layer 30 is disposed on the first side S1 of the buried insulation layer 20. The gate structure 52 is disposed on the semiconductor layer 30, and the semiconductor layer 30 includes the body region 31 disposed between the gate structure 52 and the buried insulation layer 20. The source doped region 32 and the drain doped region 33 are disposed in the semiconductor layer 30 at two opposite sides of the gate structure 52 respectively. The contact hole H penetrates the buried insulation layer 20 and exposes a part of the body region 31 and a part of the source doped region 32. The silicide layer 85 is disposed in the contact hole H and disposed on the part of the body region 31 and the part of the source doped region 32 exposed by the contact hole H. The silicide layer 85 may include metal silicide such as cobalt-silicide, nickel-silicide, or other suitable metal silicide. The body region 31 may be electrically connected with the source doped region 32 via the silicide layer 85. The fourth contact structure BC4 is disposed on the silicide layer 85. The fifth contact structure BC5 penetrates the buried insulation layer 20 and is electrically connected with the drain doped region 33.

The semiconductor device 103 may further include a connection structure (such as the second connection structure CS2) disposed on the drain doped region 33 and electrically connected with the drain doped region 33. Similar to the first embodiment mentioned above, the semiconductor device 103 may further include the isolation structure 40, the gate dielectric layer 51, the interlayer dielectric layer 60, the first connection structure CS1, and the second substrate 11. The gate dielectric layer 51, the gate structure 52, the semiconductor layer 30, the isolation structure 40, the interlayer dielectric layer 60, the first connection structure CS1, the second connection structure CS2, and the second substrate 11 may be disposed on the first side S1 of the buried insulation layer 20. Additionally, the semiconductor device 103 may further include the insulation layer 70 disposed at the second side S2 of the buried insulation layer 20, and the insulation layer 70 may be partly disposed in the contact hole H. The fourth contact structure BC4 may penetrate the insulation layer 70 for contacting the silicide layer 85, and the fourth contact structure BC4 may be at least partially disposed in the contact hole H, but not limited thereto. In some embodiments, the fourth contact structure BC4 may be partly embedded in the silicide layer 85 because of the over etching process for forming the fourth contact structure BC4, but the fourth contact structure BC4 does not penetrate the silicide layer 85 for avoiding damages to the source doped region 32 in the process of forming the fourth contact structure BC4. The fifth contact structure BC5 may penetrate the insulation layer 70, the buried insulation layer 20, the isolation structure 40, and the interlayer dielectric layer 60 located between the isolation structure 40 and the second metal layer 62B for being connected with the second connection structure CS2, and the fifth contact structure BC5 may be electrically connected with the drain doped region 33 via second metal layer 62B and the second plug 61B in the second connection structure CS2, but not limited thereto. Additionally, similar to the first embodiment described above, the fourth contact structure BC4 and the fifth contact structure BC5 may be formed by the barrier layer 81 and the conductive material 82 also, and the first conductive layer 91 and the second conductive layer 92 may be disposed on the insulation layer 70, but not limited thereto. In some embodiments, the first conductive layer 91 may contact and be electrically connected with the fourth contact structure BC4, the second conductive layer 92 may contact and be electrically connected with the fifth contact structure BC5, and the first conductive layer 91 and the second conductive layer 92 may be used to transmit signals at the back side of the semiconductor device 103, but not limited thereto.

In the semiconductor device 103, the contact hole H is disposed at a side of the semiconductor layer 30 facing the buried insulation layer 20 and exposes a part of the body region 31 and a part of the source doped region 32. The silicide layer 85 disposed in the contact hole H may electrically connect the body region 31 of the semiconductor layer 30 and the source doped region 32 for improving the kink effect. Additionally, the influence on the total area of the semiconductor device 103 may be reduced for benefiting the miniaturization of the semiconductor device 103 because the silicide layer 85 may contact and be electrically connected with the body region 31 from the back side. In some embodiments, the silicide layer 85 may be formed self-aligned, and the process window of forming the fourth contact structure BC4 may be increased by the silicide layer 85 having a relatively larger area for enhancing the manufacturing yield.

Figure 8:
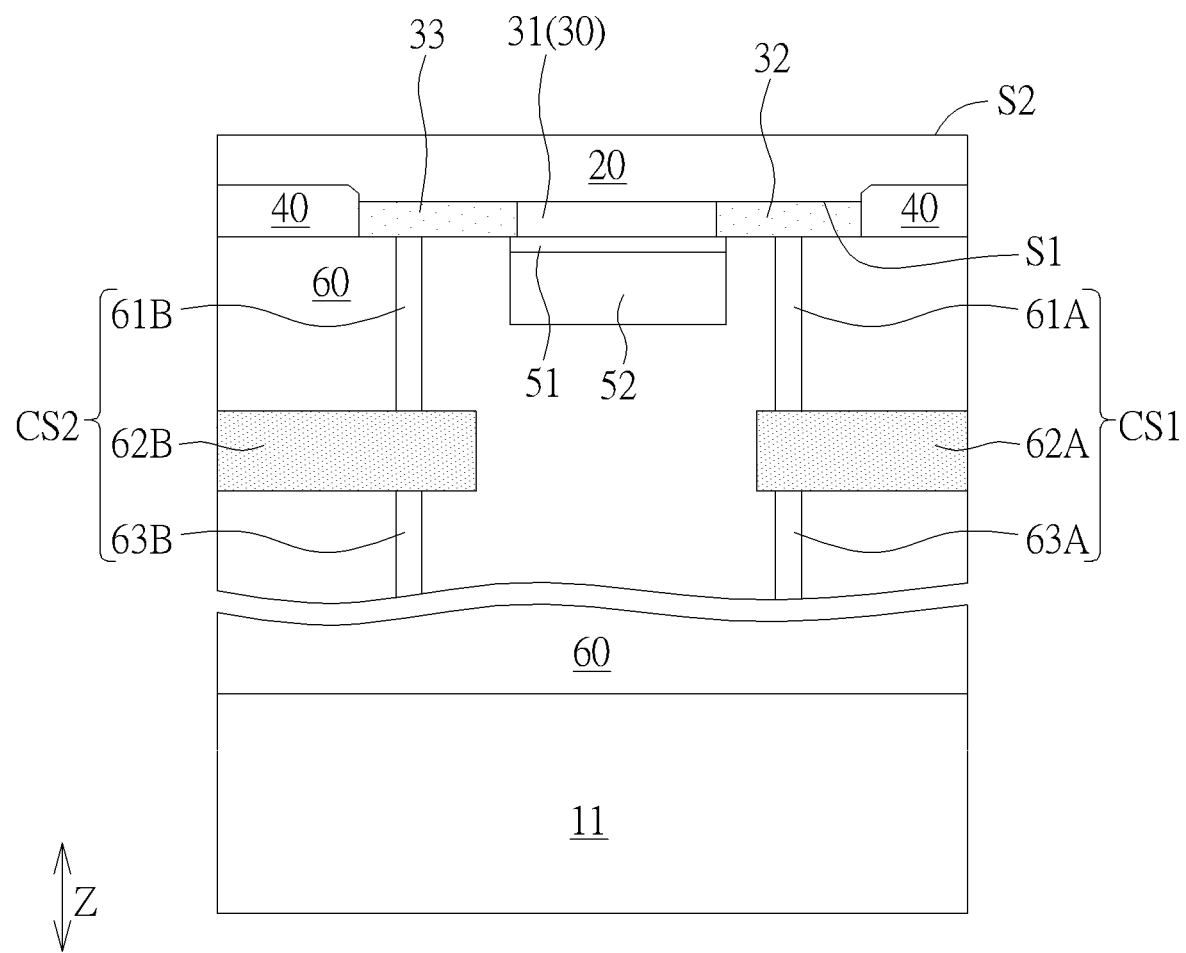
Figure 9:
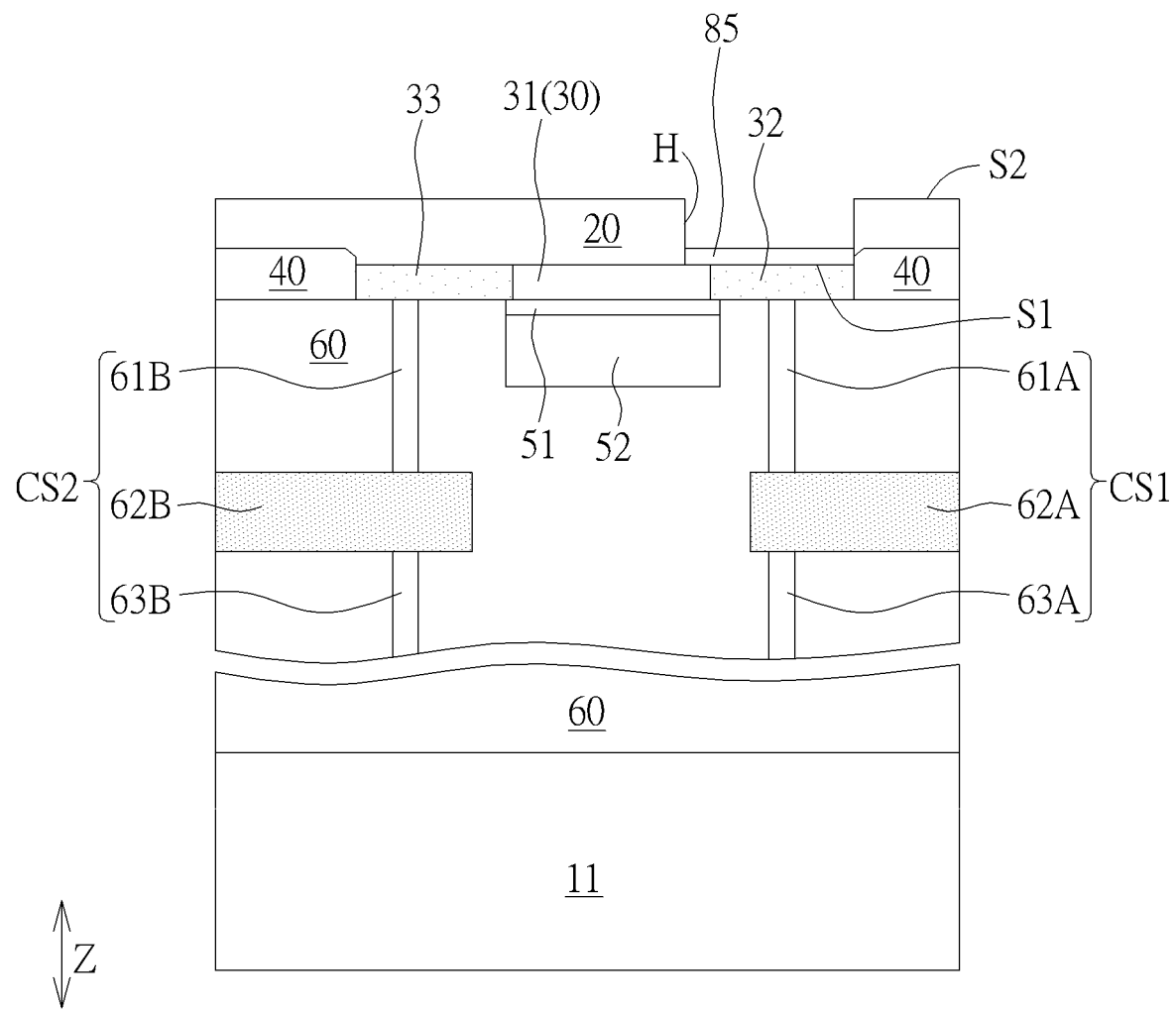

Please refer to FIGS. 7-9 and FIGS. 3-4. FIG. 8 and FIG. 9 are schematic drawings illustrating a manufacturing method of the semiconductor device according to the third embodiment of the present invention. FIG. 8 may be regarded as a schematic drawing in a step subsequent to FIG. 4, FIG. 9 is a schematic drawing in a step subsequent to FIG. 8, and FIG. 7 may be regarded as a schematic drawing in a step subsequent to FIG. 9. As shown in FIG. 7, the manufacturing method of the semiconductor device in this embodiment may include the following steps. Firstly, the semiconductor layer 30 disposed on the buried insulation layer 20 is provided. The gate structure 52 is formed on the semiconductor layer 30. The semiconductor layer 30 includes the body region 31 disposed between the gate structure 52 and the buried insulation layer 20. The source doped region 32 and the drain doped region 33 are formed in the semiconductor layer 30 at two opposite sides of the gate structure 52 respectively. The contact hole H is formed penetrating the buried insulation layer 20 and exposing a part of the body region 31 and a part of the source doped region 32. The silicide layer 85 is formed in the contact hole H. The silicide layer 85 is formed on the part of the body region 31 and the part of the source doped region 32 exposed by the contact hole H. The body region 31 is electrically connected with the source doped region 32 via the silicide layer 85. The fourth contact structure BC4 is formed on the silicide layer 85. The fifth contact structure BC5 is formed penetrating the buried insulation layer 20 and electrically connected with the drain doped region 33.

Specifically, the manufacturing method of the semiconductor device 103 in this embodiment may include but is not limited to the following steps. As shown in FIG. 3 and FIG. 4, similar to the first embodiment described above, the isolation structure 40 may be formed on the buried insulation layer 20 and the isolation structure 40 may surround the semiconductor layer 30. After the steps of forming the gate structure 52, the source doped region 32, and the drain doped region 33, the interlayer dielectric layer 60, the first connection structure CS1, and the second connection structure CS2 are formed. The first connection structure CS1 is formed on the source doped region 32, and the first connection structure CS1 is electrically connected with the source doped region 32. The second connection structure CS2 is formed on the drain doped region 33, and the second connection structure CS2 is electrically connected with the drain doped region 33. Subsequently, after the steps of forming the interlayer dielectric layer 60, the first connection structure CS1, and the second connection structure CS2, the first substrate 10 may be turned over, and a side of the interlayer dielectric layer 60 opposite to the semiconductor layer 30 may be connected with the second substrate 11. As shown in FIG. 4 and FIG. 8, the first substrate 10 is then removed to expose the second side S2 of the buried insulation layer 20. Subsequently, as shown in FIG. 8 and FIG. 9, the contact hole H is formed penetrating the buried insulation layer 20 and exposing a part of the body region 31 and a part of the source doped region 32, and the silicide layer 85 is formed in the contact hole H. In some embodiments, the silicide layer 85 may be formed by forming a metal layer (not shown) on the body region 31 and the source doped region 32 exposed by the contact hole H and performing a thermal treatment after the step of forming the metal layer for generating a reaction between the metal layer and the body region 31 and a reaction between the metal layer and the source doped region 32, and the silicide layer 85 may be formed self-aligned accordingly, but not limited thereto. Additionally, the metal layer mentioned above may be removed after the step of forming the silicide layer 85.

Subsequently, as shown in FIG. 9 and FIG. 7, the insulation layer 70, the fourth contact structure BC4, the fifth contact structure BC5, the first conductive layer 91, and the second conductive layer 92 mentioned above may be formed. In other words, the first connection structure CS1 and the second connection structure CS2 may be formed before the steps of forming the fourth contact structure BC4 and the fifth contact structure BC5, but not limited thereto. The insulation layer 70 is formed at the second side S2 of the buried insulation layer 20, and the insulation layer 70 may be partly formed in the contact hole H. The fourth contact structure BC4 may penetrate the insulation layer 70 for contacting the silicide layer 85, and the fourth contact structure BC4 may be at least partially disposed in the contact hole H. The fifth contact structure BC5 may penetrate the insulation layer 70, the buried insulation layer 20, the isolation structure 40, and the interlayer dielectric layer 60 located between the isolation structure 40 and the second metal layer 62B for being connected with the second connection structure CS2, and the fifth contact structure BC5 may be electrically connected with the drain doped region 33 via the second metal layer 62B and the second plug 61B in the second connection structure CS2, but not limited thereto. In some embodiments, the fourth contact structure BC4 and the fifth contact structure BC5 may be formed concurrently, and the fourth contact structure BC4 and the fifth contact structure BC5 may be formed by the barrier layer 81 and the conductive material 82 for process simplification, but not limited thereto. In some embodiments, the fourth contact structure BC4 and the fifth contact structure BC5 may also be formed by different processes and/or different materials according to some considerations.

To summarize the above descriptions, according to the semiconductor device and the manufacturing method thereof in the present invention, the contact structure and/or the contact hole may be formed on the side of the semiconductor layer facing the buried insulation layer for electrically connecting the body region of the semiconductor layer and the source doped region. The purpose of improving the kink effect may be achieved accordingly. In addition, the influence on the total area of the semiconductor device may be reduced for benefiting the miniaturization of the semiconductor device because the contact structure and/or the silicide layer in the contact hole may contact and be electrically connected with the body region from the back side.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
a buried insulation layer;
a semiconductor layer disposed on a side of the buried insulation layer;
a gate structure disposed on the semiconductor layer, wherein the semiconductor layer comprises a body region disposed between the gate structure and the buried insulation layer;
a source doped region and a drain doped region, wherein the source doped region and the drain doped region are disposed in the semiconductor layer at two opposite sides of the gate structure respectively;
a first contact structure penetrating the buried insulation layer and contacting a part of the body region and a part of the source doped region, wherein the first contact structure overlaps the part of the body region and the part of the source doped region in a thickness direction of the buried insulation layer, a first surface of the first contact structure directly contact a second surface of the body region and a third surface of the source doped region, and the third surface of the source doped region is located between the first surface of the first contact structure and the gate structure in the thickness direction of the buried insulation layer; and a second contact structure penetrating the buried insulation layer and electrically connected with the source doped region, wherein the body region is electrically connected with the source doped region via the first contact structure and the second contact structure.

2. The semiconductor device according to claim 1, wherein the part of the body region is disposed between the first contact structure and the gate structure in the thickness direction of the buried insulation layer.

3. The semiconductor device according to claim 1, further comprising:
   a first connection structure disposed on the source doped region and electrically connected with the source doped region; and
   an isolation structure disposed on the buried insulation layer and surrounding the semiconductor layer, wherein the second contact structure further penetrates the isolation structure and is connected with the first connection structure, and the second contact structure is electrically connected with the source doped region via the first connection structure.

4. The semiconductor device according to claim 3, further comprising:
   a second connection structure disposed on the drain doped region and electrically connected with the drain doped region; and
   a third contact structure penetrating the buried insulation layer and the isolation structure for being connected with the second connection structure, wherein the third contact structure is electrically connected with the drain doped region via the second connection structure.

5. The semiconductor device according to claim 1, wherein the buried insulation layer has a first side and a second side opposite to the first side in the thickness direction of the buried insulation layer, the semiconductor layer and the gate structure are disposed on the first side of the buried insulation layer, and the semiconductor device further comprises:
   a conductive layer disposed at the second side of the buried insulation layer and connected with the first contact structure and the second contact structure, wherein the body region is electrically connected with the source doped region via the first contact structure, the conductive layer, and the second contact structure.

6. A semiconductor device, comprising:
   a buried insulation layer, wherein the buried insulation layer has a first side and a second side opposite to the first side in a thickness direction of the buried insulation layer;
   a semiconductor layer disposed on a side of the buried insulation layer;
   a gate structure disposed on the semiconductor layer, wherein the semiconductor layer and the gate structure are disposed on the first side of the buried insulation layer, and the semiconductor layer comprises a body region disposed between the gate structure and the buried insulation layer;
   a source doped region and a drain doped region, wherein the source doped region and the drain doped region are disposed in the semiconductor layer at two opposite sides of the gate structure respectively;
   a contact hole penetrating the buried insulation layer and exposing a part of the body region and a part of the source doped region;
   a silicide layer disposed in the contact hole and disposed on the part of the body region and the part of the source doped region exposed by the contact hole, wherein the body region is electrically connected with the source doped region via the silicide layer;
   a first contact structure disposed on the silicide layer;
   a second contact structure penetrating the buried insulation layer and electrically connected with the drain doped region; and
   an insulation layer disposed at the second side of the buried insulation layer and partly disposed in the contact hole, wherein the first contact structure penetrates the insulation layer for contacting the silicide layer, and the second contact structure further penetrates the insulation layer.

7. The semiconductor device according to claim 6, wherein the first contact structure is at least partially disposed in the contact hole.

8. The semiconductor device according to claim 6, further comprising:
   a connection structure disposed on the drain doped region and electrically connected with the drain doped region; and
   an isolation structure disposed on the buried insulation layer and surrounding the semiconductor layer, wherein the second contact structure further penetrates the isolation structure and is connected with the connection structure, and the second contact structure is electrically connected with the drain doped region via the connection structure.

9. A manufacturing method of a semiconductor device, comprising:
   providing a semiconductor layer disposed on a buried insulation layer;
   forming a gate structure on the semiconductor layer, wherein the semiconductor layer comprises a body region disposed between the gate structure and the buried insulation layer;
   forming a source doped region and a drain doped region in the semiconductor layer at two opposite sides of the gate structure respectively;
   forming a first contact structure penetrating the buried insulation layer and contacting a part of the body region and a part of the source doped region, wherein the first contact structure overlaps the part of the body region and the part of the source doped region in a thickness direction of the buried insulation layer;
   forming a second contact structure penetrating the buried insulation layer and electrically connected with the source doped region, wherein the body region is electrically connected with the source doped region via the first contact structure and the second contact structure;
   forming an isolation structure on the buried insulation layer, wherein the isolation structure surrounds the semiconductor layer; and
   forming a first connection structure on the source doped region before forming the first contact structure and forming the second contact structure, wherein the first connection structure is electrically connected with the source doped region, the second contact structure further penetrates the isolation structure and is connected with the first connection structure, and the second contact structure is electrically connected with the source doped region via the first connection structure.

10. The manufacturing method of the semiconductor device according to claim 9, wherein the first contact structure and the second contact structure are formed concurrently.

11. The manufacturing method of the semiconductor device according to claim 9, further comprising:
  forming a second connection structure on the drain doped region before forming the first contact structure and forming the second contact structure, wherein the second connection structure is electrically connected with the drain doped region; and
  forming a third contact structure penetrating the buried insulation layer and the isolation structure for being connected with the second connection structure, wherein the third contact structure is electrically connected with the drain doped region via the second connection structure.

12. The manufacturing method of the semiconductor device according to claim 11, wherein the first contact structure, the second contact structure, and the third contact structure are formed concurrently.

13. The manufacturing method of the semiconductor device according to claim 9, wherein the buried insulation layer has a first side and a second side opposite to the first side in the thickness direction of the buried insulation layer, the semiconductor layer and the gate structure are formed on the first side of the buried insulation layer, and the manufacturing method of the semiconductor device further comprises:
  forming a conductive layer at the second side of the buried insulation layer, wherein the conductive layer is connected with the first contact structure and the second contact structure, and the body region is electrically connected with the source doped region via the first contact structure, the conductive layer, and the second contact structure.

14. A manufacturing method of a semiconductor device, comprising:
  providing a semiconductor layer disposed on a buried insulation layer;
  forming a gate structure on the semiconductor layer, wherein the semiconductor layer comprises a body region disposed between the gate structure and the buried insulation layer;
  forming a source doped region and a drain doped region in the semiconductor layer at two opposite sides of the gate structure respectively;
  forming a contact hole penetrating the buried insulation layer and exposing a part of the body region and a part of the source doped region;
  forming a silicide layer in the contact hole, wherein the silicide layer is formed on the part of the body region and the part of the source doped region exposed by the contact hole, and the body region is electrically connected with the source doped region via the silicide layer;
  forming a first contact structure on the silicide layer;
  forming a second contact structure penetrating the buried insulation layer and electrically connected with the drain doped region;
  forming an isolation structure on the buried insulation layer and the isolation structure surrounding the semiconductor layer; and
  forming a connection structure on the drain doped region before forming the first contact structure and forming the second contact structure, wherein the connection structure is electrically connected with the drain doped region, the second contact structure further penetrates the isolation structure and is connected with the connection structure, and the second contact structure is electrically connected with the drain doped region via the connection structure.

15. The manufacturing method of the semiconductor device according to claim 14, wherein the first contact structure and the second contact structure are formed concurrently.

16. The manufacturing method of the semiconductor device according to claim 14, wherein the first contact structure is at least partially formed in the contact hole.

17. The manufacturing method of the semiconductor device according to claim 14, wherein the buried insulation layer has a first side and a second side opposite to the first side in a thickness direction of the buried insulation layer, the semiconductor layer and the gate structure are formed on the first side of the buried insulation layer, and the manufacturing method of the semiconductor device further comprises:
  forming an insulation layer at the second side of the buried insulation layer, wherein the insulation layer is partly formed in the contact hole, the first contact structure penetrates the insulation layer for contacting the silicide layer, and the second contact structure further penetrates the insulation layer.

* * * * *